(12) United States Patent
Yang et al.

(10) Patent No.: US 10,680,070 B2
(45) Date of Patent: Jun. 9, 2020

(54) TRENCH GATE MANUFACTURING METHOD

(71) Applicant: SHANGHAI HUAHONG GRACE SEMICONDUCTOR MANUFACTURING CORPORATION, Shanghai (CN)

(72) Inventors: Jiye Yang, Shanghai (CN); Hao Li, Shanghai (CN); Lei Wang, Shanghai (CN); Longjie Zhao, Shanghai (CN); Xiaoxiang Sun, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 16/142,355

(22) Filed: Sep. 26, 2018

(65) Prior Publication Data

US 2019/0103466 A1    Apr. 4, 2019

(30) Foreign Application Priority Data

Sep. 29, 2017   (CN) .......................... 2017 1 09038648

(51) Int. Cl.
*H01L 21/336*    (2006.01)
*H01L 29/40*    (2006.01)
(Continued)

(52) U.S. Cl.
CPC ........ *H01L 29/401* (2013.01); *H01L 29/4236* (2013.01); *H01L 29/42368* (2013.01);
(Continued)

(58) Field of Classification Search
CPC .............. H01L 29/401; H01L 29/4236; H01L 29/42368; H01L 29/66613
(Continued)

(56) References Cited

U.S. PATENT DOCUMENTS 5,674,787 A    10/1997   Zhao et al.
5,897,368 A    4/1999    Cole, Jr. et al.
(Continued)

FOREIGN PATENT DOCUMENTS

CN    1586012 A    2/2005

OTHER PUBLICATIONS

First Office Action issued in corresponding Chinese Patent Application No. 201710903864.8, dated May 4, 2019, 11 Pages.
(Continued)

*Primary Examiner* — Brook Kebede
(74) *Attorney, Agent, or Firm* — MKG, LLC

(57) ABSTRACT

A trench gate manufacturing method includes the following steps: Step 1, forming a trench in the surface of a semiconductor substrate; Step 2, forming a first oxide layer; Step 3, selecting a coating according to the depth-to-width ratio of the trench and forming the coating completely filling the trench; Step 4, etching back the coating through a dry etching process; Step 5, conducting wet etching on the first oxide layer with the coating reserved at the bottom of the trench as a mask so as to form a gate bottom oxide; Step 6, removing the coating; and Step 7, growing a gate oxide. By adoption of the trench gate manufacturing method, a BTO can be realized at a low cost, and can be well-formed in trenches with smaller depth-to-width ratios and thus is suitable for forming BTOs in trenches with various depth-to-width ratios, thereby having a wider application range.

11 Claims, 3 Drawing Sheets

(51) Int. Cl.
*H01L 29/423* (2006.01)
*H01L 29/66* (2006.01)
H01L 21/311 (2006.01)
H01L 21/28 (2006.01)

(52) U.S. Cl.
CPC .. *H01L 29/66613* (2013.01); *H01L 29/66734* (2013.01); *H01L 21/28158* (2013.01); *H01L 21/31111* (2013.01); *H01L 21/31116* (2013.01); *H01L 21/31144* (2013.01)

(58) Field of Classification Search
USPC .......................................................... 438/270
See application file for complete search history.

(56) References Cited

U.S. PATENT DOCUMENTS

| | | | | |
|---|---|---|---|---|
| 2004/0005766 A1* | 1/2004 | Lai | ................... | H01L 21/76224 |
| | | | | 438/424 |
| 2004/0188756 A1* | 9/2004 | Matsuda | ............. | H01L 29/7813 |
| | | | | 257/330 |
| 2010/0207206 A1* | 8/2010 | Krischke | ............ | H01L 29/0642 |
| | | | | 257/337 |
| 2011/0275210 A1* | 11/2011 | Denison | ............ | H01L 29/42368 |
| | | | | 438/589 |

OTHER PUBLICATIONS

Search Report issued in First Office Action from corresponding Chinese Patent Application No. 201710903864.8, 4 pages.

\* cited by examiner

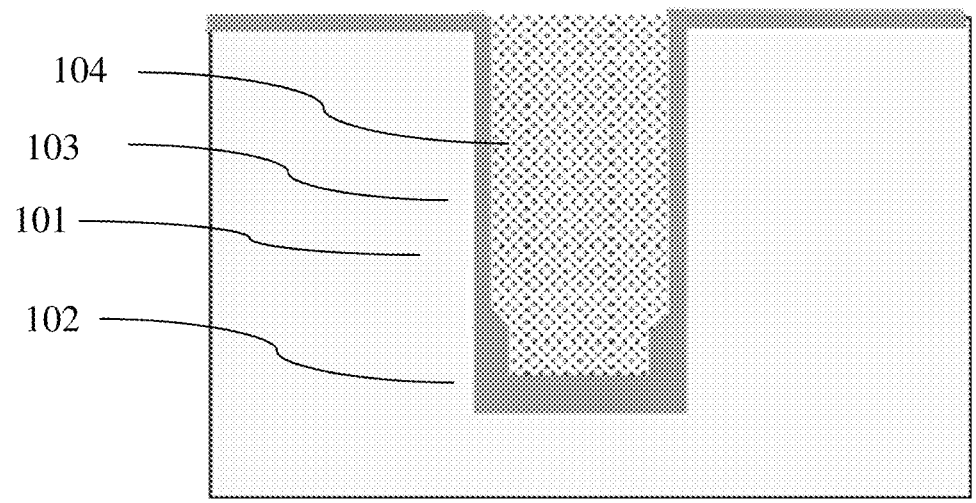
FIG. 1: PRIOR ART
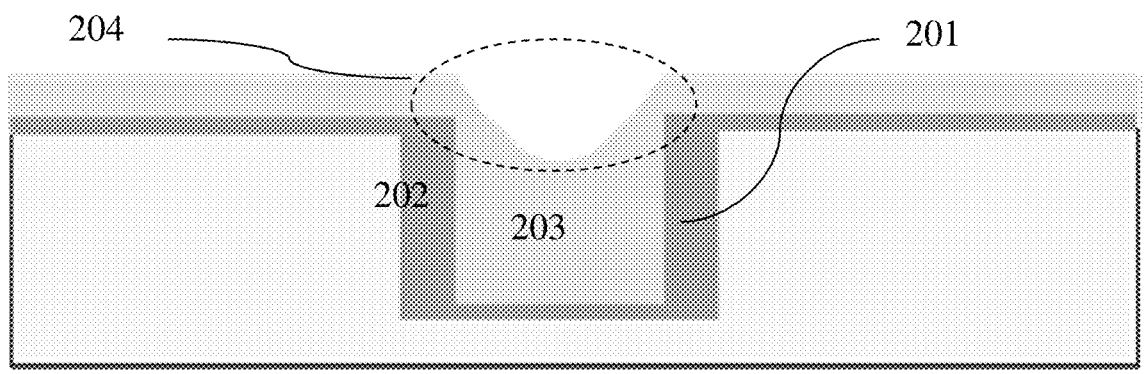
FIG. 2: PRIOR ART

TRENCH GATE MANUFACTURING METHOD

RELATED APPLICATION

The present disclosure claims priority to Chinese patent application number 201710903864.8 filed on Sep. 29, 2017, which is incorporated by reference herein in its entirety.

BACKGROUND OF THE INVENTION

Technical Field

The invention relates to a manufacturing method of a semiconductor integrated circuit, in particular to a trench gate manufacturing method.

Description of Related Art

The gate structure of a metal oxide semiconductor (MOS) transistor comprises a gate oxide and a polysilicon gate formed on the surface of the gate oxide. The polysilicon gate generally covers the channel region and is configured to form a channel on the surface of the channel region so as to achieve source-drain connection. In order to ensure high gate controllability, a thin gate oxide is usually needed. However, in order to ensure high gate reliability and a small Miller capacitance, a thick gate oxide is usually needed. Namely, the thin gate oxide facilitates control over the opening of the channel, but the Miller capacitance is increased due to the reduction of the etching property of the thin gate oxide.

Either planar gate or trench gate is applied in the gate manufacturing process. By the fact that a higher current density and a smaller on-resistance can be obtained through the trench gate, the trench gate is commonly applied to power devices.

The trench gate typically comprises a trench, a gate oxide formed on the inner surface (including the bottom surface and the side surface) of the trench, and a polysilicon gate completely filling the trench. The trench gate needs to penetrate through the channel region so that the channel region can be covered by the side surface of the polysilicon gate, and accordingly, a channel is formed on the surface of the channel region covered by the side surface of the polysilicon gate when the trench gate is opened.

From the above description, in the aspect of the thickness of the gate oxide, the requirement for high gate controllability is in conflict with the requirements for high gate reliability and the smaller Miller capacitance. As for the trench gate, for the sake of compromising, a bottom thick oxide (BTO) is usually adopted by the trench gate. In this specification, BTO refers to a gate bottom oxide. "Thick" in the BTO means that compared with the gate oxide, the BTO is thicker.

In this way, two thick oxides, namely the BTO and the gate oxide, are formed in the trench gate. The gate oxide between the polysilicon gate and the channel region is relatively thin, so that the high gate controllability is ensured. The thicker oxide (namely the BTO) is formed at the bottom and bottom corners where problems about the reliability are likely to happen, so that the reliability of the device is enhanced.

By adoption of the BTO, an extra technological process is needed, thus, increasing the manufacturing cost. For this reason, it is of great importance to realize the BTO structure at a low cost. In the prior art, the BTO is realized through two mainstream methods.

As for the first method: the trench is filled by a high-density plasma (HDP) oxide, and then the BTO is realized through chemical mechanical polishing (CMP) flattening and back-etching techniques. However, by adoption of this method, the cost is extremely high.

As for the second method: a thick BTO located on the whole inner surface and outer surface of the trench is formed; at this moment, the trench is completely filled by a photoresist, and the outer surface of the trench is also coated with the photoresist; the exposure is regulated according to the thickness difference of the photoresist on the outer surface of the trench and the photoresist in the trench to ensure complete exposure of the surface and insufficient exposure in the trench, and thus, the photoresist with a required thickness is reserved in the trench after development. The pre-formed thick gate oxide (namely the BTO) is protected by the photoresist reserved in the trench, and the thick gate oxide in other areas is removed through the wet process; and afterwards, a thin gate oxide following a baseline process is formed in the trench through film formation. From the above description, extra photo-etching is needed in the second method, and thus, the cost is also high. In addition, due to the coating characteristic of the photoresist, this method is not applicable to trench structures with a small depth-to-width ratio.

FIG. 1 is a view of a trench gate provided with a BTO and formed through the first existing method. As shown in FIG. 1, a thick BTO 102 is formed at the bottom of a trench 101, a thin gate oxide 103 is formed on the side surface, above the BTO 102, of the trench 101, and finally, the trench 101 is completely filled by a polysilicon gate 104.

FIG. 2 is a view of a trench gate provided with a BTO and formed through the second existing method after photoresist coating. As shown in FIG. 2, a trench 201 has a small depth-to-width ratio (namely the trench 201 has a small depth and a large width) so that the trench 201 can be coated with the photoresist after a thick oxide layer 202 used for forming the BTO is formed. As can be seen from FIG. 2, due to the fact that the depth-to-width ratio of the trench 201 is small, the filling state of the trench 201 by the photoresist 203 is not good, and a pit shown by the dotted line 204 is formed in the top of the trench 201 and will have a negative influence on subsequent exposure and development of the photoresist 203 and wet etching of the oxide layer 202.

BRIEF SUMMARY OF THE INVENTION

The technical issue to be settled by the invention is to provide a trench gate manufacturing method, which can form a gate bottom oxide (namely the BTO) at a low cost to reduce the process cost and can form a good BTO in a trench with a smaller depth-to-width ratio, thereby being suitable for BTO formation in trenches with various depth-to-width ratios and having a wide application range.

To settle the above technical issue, the trench gate manufacturing method of the invention comprises the following steps:

Step 1, a trench is formed in the surface of a semiconductor substrate.

Step 2, a first oxide layer is formed on the bottom surface, side surface, and outer surface of the trench, wherein the thickness of the first oxide layer is equal to the thickness of a gate bottom oxide.

Step 3, a coating is selected according to the depth-to-width ratio of the trench and then is formed on the surface of the first oxide layer, wherein the coating has a flowability meeting the conditions that the trench is completely filled by the coating and the thickness difference between the portion, located outside the trench, of the coating and the portion, located inside the trench, of the coating is greater than the height of the subsequently-obtained gate bottom oxide located on the side surface of the trench.

Step 4, the coating is comprehensively etched back through a dry etching process until the portion, located outside the trench, of the coating is entirely etched and the portion, located inside the trench, of the coating is etched to a depth required for forming the gate bottom oxide.

Step 5, wet etching is conducted on the first oxide layer with the coating reserved at the bottom of the trench as a mask until the first oxide layer is only reserved at the bottom of the trench and the gate bottom oxide is formed.

Step 6, the coating is removed.

Step 7, a gate oxide is grown, wherein the gate oxide is located on the side surface, above the gate bottom oxide, of the trench, and the thickness of the gate oxide is smaller than the thickness of the gate bottom oxide.

Furthermore, the trench gate manufacturing method further comprises the following step:

Step 8, the trench is filled with a gate electrode material layer.

Furthermore, the gate electrode material layer is a polysilicon gate.

Furthermore, the semiconductor substrate is a silicon substrate.

Furthermore, the first oxide layer is made of silicon oxide, and the gate oxide is also made of silicon oxide.

Furthermore, the first oxide layer is formed through a thermal oxidization process in Step 2; or, the first oxide layer is formed through a chemical vapor deposition process in Step 2.

Furthermore, the gate oxide is formed through a thermal oxidization process in Step 7.

Furthermore, a trench gate is a gate structure of an MOS transistor. The trench gate manufacturing method further comprises the following steps:

Step 9, a channel region is formed, wherein the depth of the channel region is smaller than the depth of the gate oxide, the polysilicon gate covers the channel region via the side surface of the gate oxide, and a channel is formed in the surface of the channel region covered by the side surface of the polysilicon gate; and the semiconductor substrate is doped to be of a first conduction type, and the channel region is doped to be of a second conduction type;

Step 10, a heavily-doped source region of the first conduction type is formed on the surface of the channel region; and Step 11, a heavily-doped drain region of the first conduction type is formed on the back side of the semiconductor substrate.

Furthermore, the coating is made from materials with a kinematic viscosity greater than or equal to 1.8 mm$^2$/s.

Furthermore, the coating is made from an anti-reflection layer or a photoresist.

Furthermore, the trench may have various depth-to-width ratios. The flowability of the coating meets the conditions where the trench with the minimum depth-to-width ratio is completely filled by the coating and the thickness difference between the portion, located outside the trench with the minimum depth-to-width ratio, of the coating and the portion, located inside the trench with the minimum depth-to-width ratio, of the coating is greater than the height of the subsequent-obtained gate bottom oxide located on the side surface of the trench.

Furthermore, the anti-reflection coating is a bottom anti-reflection coating (Barc).

Furthermore, the bottom anti-reflection coating is a GF70 bottom anti-reflection coating.

Furthermore, the drying etching in Step 4 is isotropic etching or anisotropic etching.

Furthermore, the MOS transistor is an NMOS transistor, the first conduction type is an N type, and the second conduction type is a P type; or, the MOS transistor is a PMOS transistor, the first conduction type is a P type, and the second conduction type is an N type.

According to the method of the invention, in order to form the gate bottom oxide (namely the BTO), the coating is selected according to the depth-to-width ratio of the trench after the first oxide layer corresponding to the gate bottom oxide is formed, and the flowability of the selected coating meets the conditions where the trench is completely filled by the coating and where the thickness difference between the portion, located outside the trench, of the coating and the portion, located inside the trench, of the coating is greater than the height of the subsequently-obtained BTO located on the side surface of the trench. Afterwards, the coating is comprehensively etched back directly through dry etching, so that the mask, which is formed by the coating and can ensure good formation of the BTO at the bottom of the trench, is obtained. Namely, the coating can be used as the mask for wet etching for BTO formation after being etched back, the first oxide layer at the bottom of the trench is well protected during wet etching of the oxide layer, and thus, the BTO located only at the bottom of the trench is formed. The description that the BTO is located at the bottom of the trench means that the BTO is formed on the bottom surface of the trench and extends to the bottom of the side surface of the trench.

Furthermore, according to the method of the invention, the mask used for wet etching of the BTO is formed directly through comprehensive back-etching based on dry etching without the photo-etching process, so that photo-etching is omitted, and thus, the process cost is reduced.

Furthermore, according to the method of the invention, the coating is selected according to the depth-to-width ratio of the trench and the BTO to be formed so that a good BTO can be formed in a trench with a smaller depth-to-width ratio. Compared with the second existing method which is limited by the depth-to-width ratio of the trench, the method of the invention can be applied to trenches with smaller depth-to-width ratios and is suitable for more types of trenches (namely trenches with various depth-to-width ratios), thereby having a wider application range.

According to the method of the invention, the coating is etched through dry etching, and through isotropic etching or anisotropic etching, a spacer is prevented from being formed by residues of the coating on the side surface of the trench after the coating is etched back. Thus, the method of the invention can well achieve spacer-free etching.

BRIEF DESCRIPTION OF THE SEVERAL VIEWS OF THE DRAWINGS

The invention is further described in detail as follows in combination with the drawings and specific embodiments.

FIG. 1 is a view of a trench gate provided with a BTO and formed through a first existing method;

FIG. 2 is a view of a trench gate provided with a BTO and formed through a second existing method after photoresist coating;

DETAILED DESCRIPTION OF THE INVENTION

Figure 3:
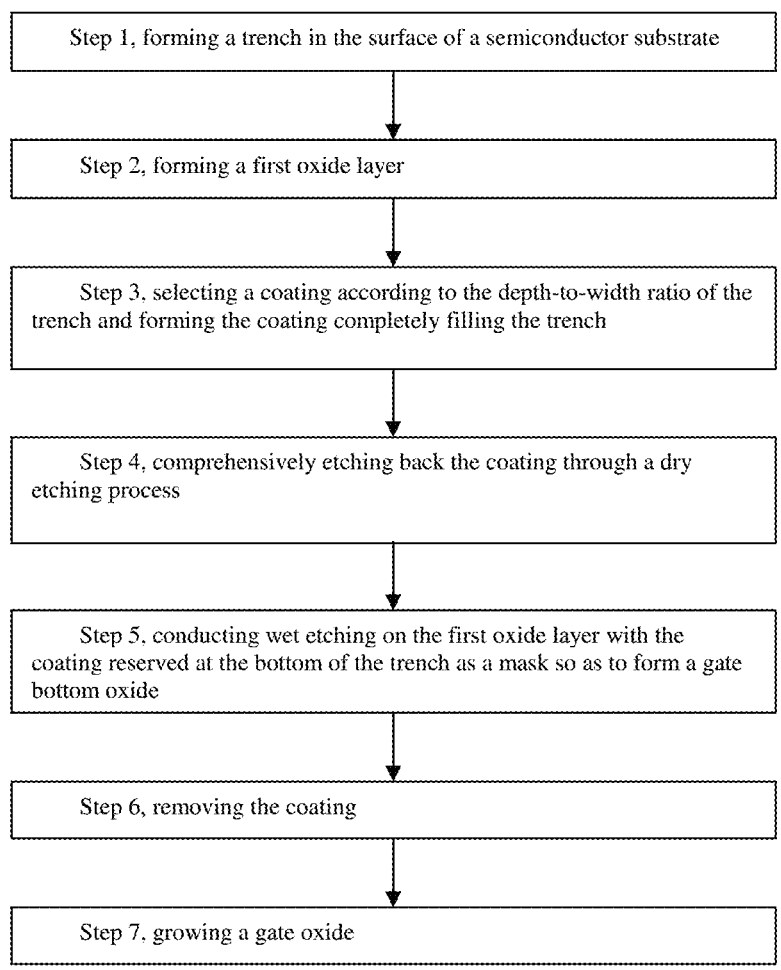
FIG. 3 is a flow diagram of a trench gate manufacturing method in accordance with one embodiment of the invention.
Figure 4A:
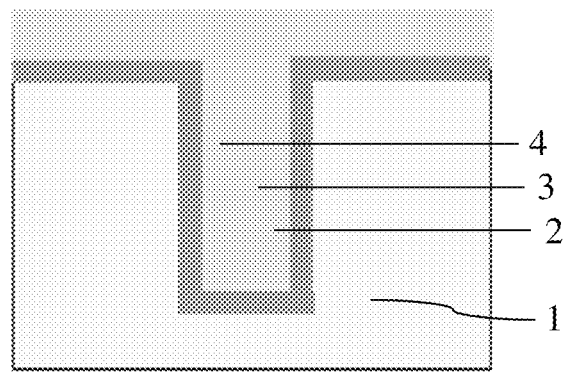
FIGS. 4A-4C are device structural views of the trench gate manufacturing method in accordance with one embodiment of the invention.
Figure 4B:
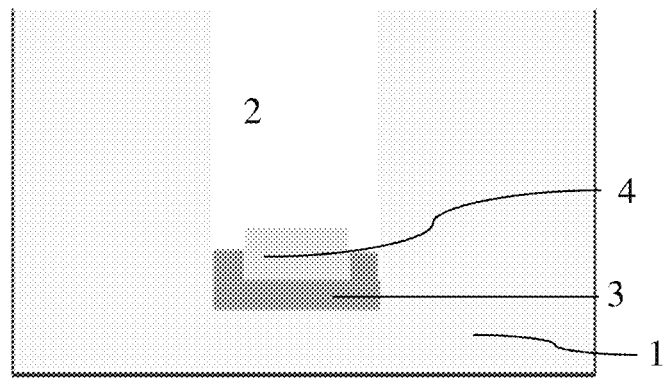
Figure 4C:
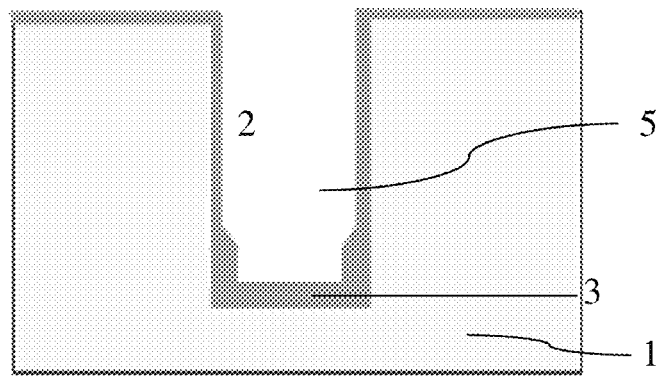

FIG. 3 is the flow diagram of the trench gate manufacturing method in accordance with one embodiment of the invention, and FIGS. 4A-4C are device structural views of the trench gate manufacturing method in accordance with one embodiment of the invention. As shown in FIG. 3 and FIGS. 4A-4C, the trench gate manufacturing method in the embodiment of the invention comprises the following steps:

Step 1, as shown in FIG. 4A, a trench 2 is formed in the surface of a semiconductor substrate 1. In this embodiment of the invention, the semiconductor substrate 1 is a silicon substrate.

Step 2, as shown in FIG. 4A, a first oxide layer 3 is formed on the bottom surface, side surface, and outer surface of the trench 2, wherein the thickness of the first oxide layer 3 is equal to the thickness of a gate bottom oxide 3 of a trench gate. In this embodiment of the invention, the first oxide layer 3 is made from silicon oxide and is formed through a thermal oxidization process or is formed through a chemical vapor deposition process.

Step 3, as shown in FIG. 4A, a coating 4 is selected according to the depth-to-width ratio of the trench 2 and then is formed on the surface of the first oxide layer 3, wherein the coating 4 has a flowability meeting the conditions where the trench 2 is completely filled by the coating 4 and where the thickness difference between the portion, located outside the trench 2, of the coating 4 and the portion, located inside the trench 2, of the coating 4 is greater than the height of the subsequently-obtained gate bottom oxide 3 located on the side surface of the trench 2.

In this embodiment of the invention, the coating is made from materials with a kinematic viscosity greater than or equal to 1.8 mm$^2$/s, for instance, the coating 4 can be made from an anti-reflection coating or a photoresist, with a kinematic viscosity greater than or equal to 1.8 mm$^2$/s.

The trench 2 can have various depth-to-width ratios. Preferably, the flowability of the coating 4 should meet the conditions where the trench 2, with the minimum depth-to-width ratio, is completely filled by the coating 4 and where the thickness difference between the portion, located outside the trench 2, with the minimum depth-to-width ratio, of the coating 4 and the portion, located inside the trench 2, with the minimum depth-to-width ratio, of the coating 4 is greater than the height of the subsequently-obtained gate bottom oxide 3 located on the side surface of the trench 2.

Preferably, the anti-reflection coating is a bottom anti-reflection coating such as a GF 70 bottom anti-reflection coating. After measurement, the kinematic viscosity of GF70 at a temperature of 25° C. is 2.7 mm$^2$/s~2.8 mm$^2$/s, and thus, GF70 can be well applied to this embodiment of the invention.

Step 4, as shown in FIG. 4B, the coating 4 is comprehensively etched back through a dry etching process until the portion, located outside the trench 2, of the coating 4 is etched away and the portion, located inside the trench 2, of the coating 4 is etched back to a depth required for forming the gate bottom oxide 3.

In the embodiment of the invention, the drying etching is isotropic etching or anisotropic etching.

Step 5, as shown in FIG. 4B, wet etching is conducted on the first oxide layer 3 with the coating 4 reserved at the bottom of the trench 2 as a mask until the first oxide layer 3 is only reserved at the bottom of the trench 2 and the gate bottom oxide 3 is formed.

Step 6, as shown in FIG. 4C, the coating 4 is removed.

Step 7, as shown in FIG. 4C, a gate oxide 5 is grown, wherein the gate oxide 5 is located on the side surface, above the gate bottom oxide 3, of the trench 2, and the thickness of the gate oxide 5 is smaller than the thickness of the gate bottom oxide 3. In this embodiment of the invention, the gate oxide 5 is made from silicon oxide and is formed through a thermal oxidization process.

The trench gate manufacturing method further comprises the following step:

Step 8, the trench 2 is filled with a gate electrode material layer. Preferably, the gate electrode material layer is a polysilicon gate.

In this embodiment of the invention, the trench gate is a gate structure of an MOS transistor. The trench gate manufacturing method further comprises the following steps:

Step 9, a channel region is formed, wherein the depth of the channel region is smaller than the depth of the gate oxide 5, the polysilicon gate covers the channel region via the side surface of the gate oxide 5, and a channel is formed in the surface of the channel region covered by the side surface of the polysilicon gate; and the semiconductor substrate 1 is doped to be of a first conduction type, and the channel region is doped to be of a second conduction type.

Step 10, a heavily-doped source region of the first conduction type is formed on the surface of the channel region.

Step 11, a heavily-doped drain region of the first conduction type is formed on the back side of the semiconductor substrate 1.

In this embodiment of the invention, the MOS transistor is an NMOS transistor, the first conduction type is an N type, and the second conduction type is a P type. In other embodiments, the MOS transistor can be a PMOS transistor, the first conduction type is a P type, and the second conduction type is an N type.

According to the method in this embodiment of the invention, in order to form the gate bottom oxide 3 (namely the BTO), the coating 4 is selected according to the depth-to-width ratio of the trench 2 after the first oxide layer 3 corresponding to the gate bottom oxide 3 is formed, and the flowability of the selected coating 4 meets the conditions where the trench 2 is completely filled by the coating 4 and where the thickness difference between the portion, located outside the trench 2, of the coating 4 and the portion, located inside the trench 2, of the coating 4 is greater than the height of the subsequently-obtained BTO located on the side surface of the trench 2. Afterwards, the coating 4 is comprehensively etched back directly through dry etching, so that the mask, which is formed by the coating 4 and can ensure good formation of the BTO at the bottom of the trench 2, is obtained. Namely, the coating 4 can well be used as the mask for wet etching for BTO formation after being etched back, the first oxide layer 3 at the bottom of the trench 2 is well protected during wet etching of the oxide layer, and thus, the BTO located only at the bottom of the trench 2 is formed. The description that the BTO is located at the bottom of the trench 2 means that the BTO is formed on the bottom surface of the trench 2 and extends to the bottom of the side surface of the trench 2.

Furthermore, according to the method in this embodiment of the invention, the mask used for wet etching of the BTO is formed directly through comprehensive back-etching based on dry etching without the photo-etching process, so that photo-etching is omitted through the method in this embodiment, and thus, the process cost is reduced.

Furthermore, according to the method in this embodiment of the invention, the coating 4 is selected according to the depth-to-width ratio of the trench 2 and the BTO to be formed so that a good BTO can be formed in a trench 2 with a smaller depth-to-width ratio. Compared with the second existing method which is limited by the depth-to-width ratio of the trench 2, the method in this embodiment of the invention can be applied to trenches 2 with smaller depth-to-width ratios and is suitable for more types of trenches 2 (namely trenches 2 with various depth-to-width ratios), thereby having a wider application range.

According to the method in this embodiment of the invention, the coating 4 is etched through dry etching, and through isotropic etching or anisotropic etching, a spacer is prevented from being formed by residues of the coating 4 on the side surface of the trench 2 after the coating 4 is etched back. Thus, the method in this embodiment of the invention can well achieve spacer-free etching.

The invention is described in detail through the above specific embodiments, but the invention is not limited to these embodiments. Without deviating from the principle of the invention, various transformations and improvements can be made by those skilled in this field, and all these transformations and improvements should fall within the protection scope of the invention.

What is claimed is:

1. A trench gate manufacturing method, comprising the following steps:
   Step 1, forming a trench in a surface of a semiconductor substrate;
   Step 2, forming a first oxide layer on a bottom surface, a side surface and an outer surface of the trench, wherein the first oxide layer has a thickness equal to a thickness of a gate bottom oxide;
   Step 3, selecting a coating according to a depth-to-width ratio of the trench and then forming the coating on a surface of the first oxide layer, the coating is a GF70 bottom anti-reflection coating, wherein the coating has a flowability meeting conditions where the trench is completely filled by the coating and where a thickness difference between a portion, located outside the trench, of the coating and a portion, located inside the trench, of the coating is greater than a height of the subsequently-obtained gate bottom oxide located on a side surface of the trench;
   Step 4, etching back the coating through a dry etching process until the portion, located outside the trench, of the coating is etched away and the portion, located inside the trench, of the coating is etched to a depth required for forming the gate bottom oxide;
   Step 5, conducting wet etching on the first oxide layer with the coating reserved at a bottom of the trench as a mask until the first oxide layer is only reserved at the bottom of the trench and the gate bottom oxide is formed;
   Step 6, removing the coating; and
   Step 7, growing a gate oxide, wherein the gate oxide is located on the side surface, above the gate bottom oxide, of the trench and has a thickness smaller than the thickness of the gate bottom oxide.

2. The trench gate manufacturing method according to claim 1, wherein the trench gate manufacturing method further comprises the following step:
   Step 8, filling the trench with a gate electrode material layer.

3. The trench gate manufacturing method according to claim 2, wherein the gate electrode material layer is a polysilicon gate.

4. The trench gate manufacturing method according to claim 2, wherein a trench gate is a gate structure of an MOS transistor, and the trench gate manufacturing method further comprises the following steps:
   Step 9, forming a channel region, wherein the channel region has a depth smaller than a depth of the gate oxide, the polysilicon gate covers the channel region via a side surface of the gate oxide, and a channel is formed in a surface of the channel region covered by a side surface of the polysilicon gate; and the semiconductor substrate is doped to be of a first conduction type, and the channel region is doped to be of a second conduction type;
   Step 10, forming a heavily-doped source region of the first conduction type on a surface of the channel region; and
   Step 11, forming a heavily-doped drain region of the first conduction type on a back side of the semiconductor substrate.

5. The trench gate manufacturing method according to claim 4, wherein the MOS transistor is an NMOS transistor, the first conduction type is an N type, and the second conduction type is a P type; or, the MOS transistor is a PMOS transistor, the first conduction type is a P type, and the second conduction type is an N type.

6. The trench gate manufacturing method according to claim 1, wherein the semiconductor substrate is a silicon substrate.

7. The trench gate manufacturing method according to claim 6, wherein the first oxide layer is made from silicon oxide, and the gate oxide is also made from silicon oxide.

8. The trench gate manufacturing method according to claim 7, wherein the first oxide layer is formed through a thermal oxidization process in Step 2; or, the first oxide layer is formed through a chemical vapor deposition process in Step 2.

9. The trench gate manufacturing method according to claim 7, wherein the gate oxide is formed through a thermal oxidization process.

10. The trench gate manufacturing method according to claim 1, wherein the trench has various depth-to-width ratios, and the flowability of the coating meets the conditions where a trench with the minimum depth-to-width ratio is completely filled by the coating and a thickness difference between a portion, located outside the trench with the minimum depth-to-width ratio, of the coating and a portion, located inside the trench with the minimum depth-to-width ratio, of the coating is greater than the height of the subsequently-obtained gate bottom oxide located on the side surface of the trench.

11. The trench gate manufacturing method according to claim 1, wherein the drying etching in Step 4 is isotropic etching or anisotropic etching.

* * * * *